United States Patent [19]

Murakami et al.

[11] Patent Number: 5,430,311
[45] Date of Patent: Jul. 4, 1995

[54] CONSTANT-VOLTAGE DIODE FOR OVER-VOLTAGE PROTECTION

[75] Inventors: Susumu Murakami, Ibaraki; Yukimasa Satou, Hitachi; Hiroshi Narita, Katsuta, all of Japan

[73] Assignee: Hitachi, Ltd., Tokyo, Japan

[21] Appl. No.: 947,518

[22] Filed: Sep. 21, 1992

[30] Foreign Application Priority Data

Sep. 20, 1991 [JP] Japan ................................. 3-241874

[51] Int. Cl.6 ........................ H01L 29/90; H01L 29/74
[52] U.S. Cl. ..................................... 257/146; 257/149;
257/551; 257/603
[58] Field of Search ............... 257/603, 604, 605, 606,
257/551, 119, 121, 129, 132, 138, 146, 147, 149,
168

[56] References Cited

U.S. PATENT DOCUMENTS

| | | | |
|---|---|---|---|
| 4,683,483 | 7/1987 | Burnham et al. | 257/551 |
| 5,001,537 | 3/1991 | Colman et al. | 257/603 |

FOREIGN PATENT DOCUMENTS

| | | | |
|---|---|---|---|
| 56-104487 | 8/1981 | Japan | 257/146 |
| 60-76174 | 4/1985 | Japan | 257/605 |
| 1-281771 | 11/1989 | Japan | 257/168 |
| 3-174775 | 7/1991 | Japan | 257/149 |

OTHER PUBLICATIONS

Patent Abstract of Japan, vol. 9, No. 318 (E-366) 13 Dec. 1985 and JP-A-60 152 057 (Hitachi Maikuro Computer Engineering KK) 10 Aug. 1985 (abstract).

*Primary Examiner*—William Mintel
*Assistant Examiner*—Minhloan Tran
*Attorney, Agent, or Firm*—Antonelli, Terry, Stout & Kraus

[57] ABSTRACT

A constant-voltage diode has a first semiconductor region of a first conductivity type, an adjoining semiconductor region of a second conductivity type, a third semiconductor region of the second conductivity type adjoining the second semiconductor region, and a fourth semiconductor region of the first conductivity type partially surrounded by the second semiconductor region. At low reverse biases between a cathode electrode and an anode electrode, the behavior of the device is determined by the pn junction between the first and second semiconductor regions. As the reverse biasing increases, the depletion layers of that junction will reach the fourth semiconductor region, but the reverse bias at this time is insufficient to break down that junction. A further increase of reverse bias causes breakdown of the pn junction between the third and fourth semiconductor regions. This effect is achieved by suitable impurity concentrations in the semiconductor regions. A plurality of fourth semiconductor regions may be provided, and a bi-directional structure can be obtained by providing a polarity reversed structure with the first semiconductor region in common.

25 Claims, 13 Drawing Sheets

CONSTANT-VOLTAGE DIODE FOR OVER-VOLTAGE PROTECTION

BACKGROUND OF THE INVENTION

1. Field of the Invention

The present invention relates to a constant-voltage diode, such as a Zener diode. It also relates to a process of producing such a constant-voltage diode and to applications using such a constant-voltage diode.

Summary of the Prior Art

A constant-voltage diode, such as a Zener diode, is normally provided with a pn junction formed by n-type and p-type semiconductor regions having high impurity concentration. In order for the pn junction to have a predetermined withstand voltage, the known practice is to form a p-type guard ring region, which is deeper than the p-type semiconductor region, in peripheral parts of the pn junction when the pn junction is formed with the n-type semiconductor region and the p-type semiconductor region having a higher impurity concentration. With this technique, Zener diodes having improved reliability were said to be producable with a high production efficiency. It is also known, moreover, that the surge withstand volume can be prevented from decreasing, because of current concentration, by dividing the principal pn junction region surrounded by a guard ring region into a plurality of parts and locating these parts symmetrically, as disclosed in JP-A-57-129475. Notwithstanding this, no high- and constant-voltage diode is readily obtainable since the n-type semiconductor having high impurity concentration for attaining constant voltage and the p-type semiconductor are set adjacent each other with a constant voltage of 10 V or lower.

For a conventional high voltage diode of the type referred to above, an article by K. P. Brieger et al entitled "The Influence of Surface Charge and Bevel Angle on the Blocking Behavior of a High-Voltage p+nn+Device," IEEE Transaction on Electron Devices," VOL. ED-31, No. 6,733, )(1984) showed that the electric field intensity of the exposed surface of a pn junction is reduced by controlling the (bevel) angle intersecting the pn junction on the side edge face of a semiconductor substrate. It was suggested that a high-voltage diode could then be produced.

SUMMARY OF THE PRESENT INVENTION

The diode described in the article by K. P. Brieger et al referred to above has the disadvantage that, as the electric field intensity on the surface of the semiconductor is not consistent, the electric field tends to intensify on the surface of the n-type semiconductor adjacent the p-type semiconductor side or close to the side of the n-type semiconductor having high impurity concentration. This depends on the bevel angle, the size of the charge polarity in the protective film on the surface of the semiconductor and the like, and causing the diode to break down easily. In other words, the breakdown phenomenon would not occur uniformly at the pn junction within the element at the time the breakdown occurs but on the edge face. Even though a high- and constant-voltage diode is obtainable in such a case, the heat that may locally be generated at the time of breakdown tends to cause destruction thereof.

The known diodes described above operate on the basis of avalanche or Zener breakdown. When this is applied to a high-voltage element, inconsistencies occur in the pn junction surface. Hence, current concentration at the time of breakdown may cause the element to fail. When such a known diode is used for a GTO thyristor as a switching element or in a snubber circuit as a protective circuit for a transistor and or an IGBT, a high spike voltage may be produced at both ends of the diode because of the inductance of the wiring. Hence, both the snubber diode and also the switching element may fail. In addition to these problems, a power converter and semiconductor elements of the power converter may fail when a high spike voltage resulting from the fluctuation of the bus voltage in the power system due to e.g. lightening is applied to the power converter.

In all the known diodes referred to above, the behavior of the diode is determined by a single pn junction. At its most general, the present invention proposes that a diode be formed with two (or more) pn junctions which are biased in the same direction by a voltage applied to the diode. Those junctions are then arranged so that they have different breakdown voltages. In this way, it is possible for the diode to be arranged so that one pn junction controls the behavior of the diode below a predetermined voltage which is less than the breakdown voltage of that junction, and above which predetermined voltage the other pn junction breaks down, via avalanche or Zener breakdown. Thus, the diode can be designed so that one pn junction breaks down at a particular reverse biasing, but the other junction is not in break-down at that reverse biasing and a stable constant-voltage diode may thus be obtained.

With the present invention, a constant-voltage diode may have three semiconductor regions of alternating conductivity type, and a fourth semiconductor region is also provided within the diode, which fourth semiconductor region is at least partially surrounded by the central semiconductor region. This fourth region is of opposite conductivity type to the central region. Normally, the fourth region adjoins one of the outer semiconductor regions, and so forms a pn junction with it. By selecting the impurity concentrations of the four semiconductor regions, it is possible for the pn junction between the fourth semiconductor region and the adjacent outer semiconductor region to have a different breakdown voltage from the pn junction (first pn junction) formed by the central and other outer region. Thus, according to a further aspect of the present invention, the impurity concentration of at least one of the fourth and adjacent outer semiconductor regions have an impurity concentration which is greater than the central and other outer semiconductor region which form the first pn junction.

It is preferable that the impurity concentration of the central region is less than both the fourth and adjacent outer semiconductor regions, and it is also preferable that the other outer semiconductor region has an impurity concentration which is less than the fourth and adjacent outer semiconductor region, as this ensures the maximum difference in behavior of the two pn junctions, but it is not essential to the present invention.

With a constant-voltage diode as described above, the behavior thereof at low reverse biasing voltages is determined by the first pn junction between the central and outer semiconductor region which is not contacted by the fourth semiconductor region. The pn junction (second pn junction) between the fourth and adjacent outer semiconductor region remains in thermal equilibrium, because of the higher impurity concentrations of the at least one of the regions. Hence, as the reverse biasing increases, the width of the depletion layers extending from the first pn junction increase. However, the diode is then designed such that the depletion layer reaches the junction between the central and fourth semiconductor regions before that first pn junction breaks down. From this point, an increase in the reverse biasing starts to widen the depletion layers of the second pn junction formed by the fourth and adjacent outer semiconductor regions, until that second pn junction breaks down. It has been found that the result in breakdown voltage is stable.

Furthermore, the point of breakdown is accurately controlled, corresponding to the area of the fourth semiconductor region. Also, since the breakdown voltage is determined by the contacting of the depletion layers of the first pn junction with the junction between the fourth and central semiconductor regions, the breakdown voltage is determined primarily by physical dimensions and thus exhibits good temperature stability. In existing Zener diodes, temperature stability is poor.

It is important to understand that the present invention relates to a semiconductor diode, i.e. a two terminal device. Multi-layer semiconductor elements having more than one pn junction are known, such as thyristors, but they have additional electrodes and so are not diodes.

Within the present invention, many developments are possible. For example, it is possible to provide regions of high impurity concentration between one or both of the outer regions discussed above and the electrodes of the diode, to improve the electrical contact therebetween.

Where a single fourth semiconductor region is provided, it is preferable that the central semiconductor region wholly surrounds it (in plan view) to isolate that fourth semiconductor region from the periphery of the device. Otherwise, the behavior of the device could be affected by charge build-up on that periphery.

However, in a development of the present invention, a plurality of such fourth semiconductor regions are provided. The reason for this is that the current capacity at breakdown of the device is limited by the area of the fourth semiconductor region or regions. Therefore, that current capacity may be insufficient if only one fourth semiconductor region is provided. It is undesirable to make that fourth semiconductor region very large, as it is then difficult to ensure that the behavior of the second pn junction between that fourth semiconductor region and the adjacent outer semiconductor region is wholly uniform. By providing a plurality of such fourth semiconductor regions, the current capacity breakdown may be improved.

Furthermore, those fourth semiconductor regions may be interconnected by further semiconductor regions of the same conductivity type but with lower impurity concentration. In this case, the central semiconductor region does not wholly surround each fourth semiconductor region. The effect of those further semiconductor regions is to ensure that the fourth semiconductor regions have the same potential, and so break down uniformly. Those further semiconductor regions may be formed so as to contact the outer semiconductor region which is adjacent the fourth semiconductor region, or may be wholly embedded within the central semiconductor region.

It is also possible to make use of the present invention in a bi-directional diode by providing a diode with the semiconductor regions described above, and with semiconductor regions which are a mirror image, in terms of polarity, with the region which is not contacted by the fourth semiconductor regions being in common. Thus, the effects of the present invention are exhibited by one part of the diode for reverse biasing in one direction, and by the mirror image part of the diode for reverse biasing in the other direction.

Diodes according to the present invention find many applications. For example, the diodes may be applied to a snubber circuit with such a diode protecting the switching element, or to power converters. The present invention relates to such applications, and also to a method of making the diodes referred to above.

BRIEF DESCRIPTION OF THE DRAWINGS

Embodiments of the present invention will now be described in detail, by way of example, with reference to the accompanying drawings in which.

DETAILED DESCRIPTION

Figure 1:
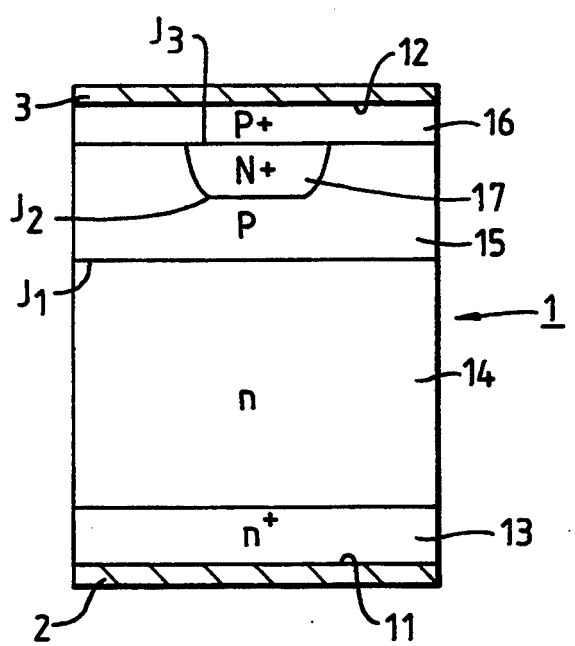
FIG. 1 is a sectional view through a constant-voltage diode being a first embodiment of the present invention.

FIG. 1 is a schematic diagram illustrating a constant-voltage diode according to a first embodiment of the present invention. In FIG. 1, there is shown a semiconductor substrate 1 with a pair of principal surfaces 11, 12. There is an n+ type semiconductor region 13 adjacent one principal surface 11. An n-type semiconductor region 14 is adjacent the n+ type semiconductor region 13 and has an impurity concentration lower than that of the n+ type semiconductor layer 13. A p-type semiconductor region 15 is adjacent the n-type semiconductor region 14, forms a pn junction $J_1$ with the n-type semiconductor region 14, and has an impurity concentration higher than that of the n-type semiconductor region 14. A p+ type semiconductor region is adjacent the p-type semiconductor layer 15 and the other principal surface 12 and has an impurity concentration higher than that of the p-type semiconductor region 15. An n+ type semiconductor region 17 is embedded between the p-type semiconductor region 15 and a p+ type semiconductor region 16 and has an impurity concentration higher than that of the p-type semiconductor region 15. A cathode electrode 2 is in ohmic contact with the n+ type semiconductor region 13 at the principal surface 11, and an anode electrode 3 is in ohmic contact with the p+ type semiconductor region 16 at the other principal surface 12. The n+-type semiconductor region 13 is provided to improve the electrical connection between the cathode electrode 2 and the n-type semiconductor region 14, and is not vertical to the functioning of the diode. It should be noted that although FIG. 1 shows the embedded region 17 as surrounded on the sides and bottom by the region 15, the region 17 can be completely embedded in the region 15 so that a portion of the region 15 covers the top of the region 17 as well.

Figure 2:
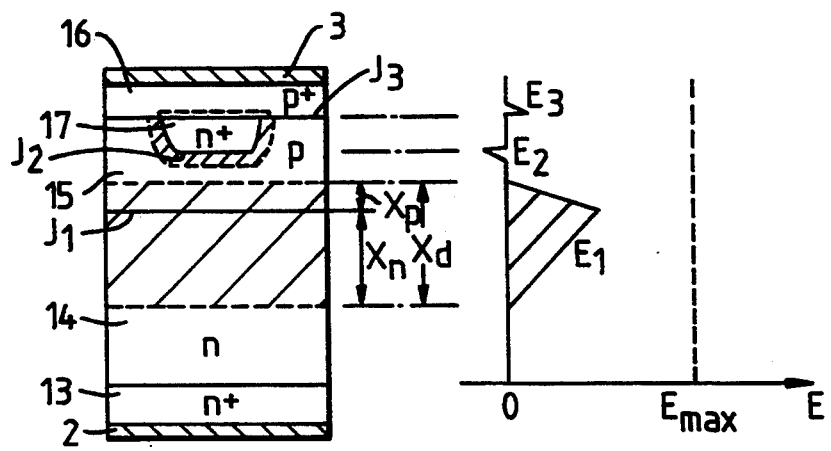
FIG. 2 is a diagram illustrating the operation of a constant-voltage diode of FIG. 1, when a small reverse bias is applied.
Figure 3:
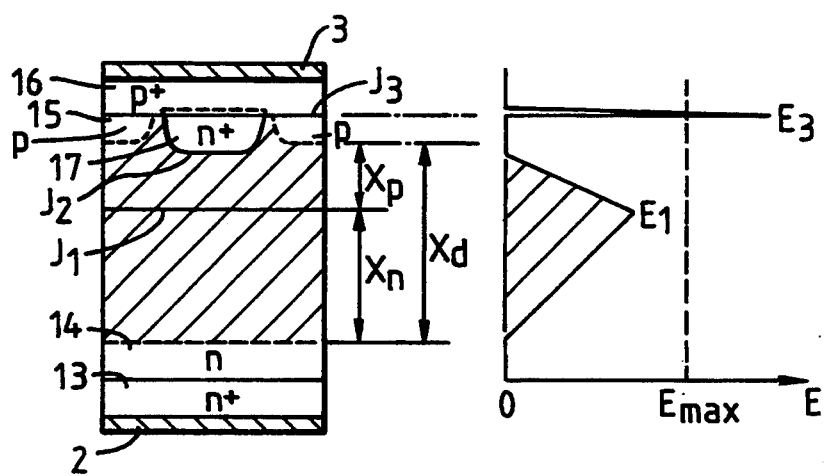
FIG. 3 is a diagram corresponding to FIG. 2, but showing the operation when the reverse bias is large.
Figure 4:
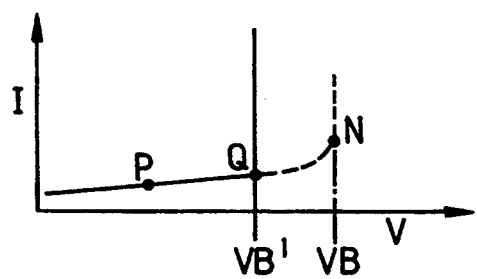
FIG. 4 illustrates the current/voltage characteristic of a constant-voltage diode according to the present invention.

Referring now to FIGS. 2, 3 and 4, the operation of the constant-voltage diode of the first embodiment of the present invention will be described. In these Figures, parts corresponding to parts of the embodiment of FIG. 1 are designated by the same reference numerals.

FIG. 2 illustrates the expansion of a depletion layer and the distribution of electronic fields when a voltage (reverse bias voltage) is applied between the anode and cathode electrodes 3, 2 in such a way that the anode electrode 3 becomes negative and when the voltage thus applied is lower than a predetermined voltage. The depletion layer resulting from the reverse bias voltage thus applied expands from the pn junction $J_1$ formed as the p-type and n-type semiconductor regions 15, 14. The depletion layer expands by a width $x_p$ into the p-type semiconductor region 15, and it expands a width $x_n$ into the n-type semiconductor region 14. Moreover, a depletion layer in a state of thermal equilibrium exists at a pn junction $J_2$ formed by contact of the p-type semiconductor region 15 with the n+ type semiconductor layer 17.

The impurity concentration of the p-type semiconductor region 15 and the depth of the pn junction $J_1$ are chosen so that, when the reverse bias voltage is low, the depletion layer of the pn junction $J_1$ expanding into the p-type semiconductor region 15 does not reach the depletion layer of the pn junction $J_2$. Consequently, the depletion layers respectively existing at the pn junction $J_2$ formed between the n+ type semiconductor region 17 and the p-type semiconductor region 15 and a pn junction $J_3$ formed between the n+ type semiconductor region 17 and the p+ type semiconductor region 16 are maintained in a state of thermal equilibrium.

In this state, the highest intensity of the electric field is at the pn junction $J_1$ formed by the p-type semiconductor region 15 and the n-type semiconductor region 14. If the intensity of the electric field in the depletion layer around junction $J_1$ is $E_1$, the intensity $E_1$ of the electric field does not reach a maximum intensity of $E_{max}$ at which the Zener or avalanche breakdown occurs. The value of the reverse voltage in this state stays at point P of on the leakage current curve as shown in FIG. 4.

If, subsequently, the reverse voltage is increased from the state corresponding to the point P, the depletion layer of the pn junction $J_1$ expands further, as shown in FIG. 3, and the width of the depletion layer from the pn junction $J_1$ expands until it comes in contact with the depletion layer at the pn junction $J_2$, which is in a state of thermal equilibrium. In this state, the intensity $E_2$ of the electric field of the pn junction $J_2$ formed by the n+ type semiconductor region 17 and the p-type semiconductor region 15 decreases substantially to zero. However, the intensity $E_3$ of the electric field at the pn junction $J_3$ (formed by the n+ type semiconductor region 17 and the p+ type semiconductor region 16) then will increase. The intensity $E_3$ of the electric field will cause a breakdown if it exceeds the maximum intensity of $E_{max}$ at which Zener or avalanche breakdown occurs. Therefore, no reverse voltage exceeding a value corresponding to the maximum intensity $E_{max}$ occurs. In other words, the voltage to be applied may be maintained constant at a high level designated by point Q in FIG. 4.

Thus, the constant-voltage diode of the first embodiment is such that small reverse bias voltages, which do not result in electric fields less than $E_{max}$, cause an increase in the width of junction $J_1$, without there being an increase in the width of the depletion layer at junction $J_3$. This requires choice of the impurity concentrations of the semiconductor regions 14, 15, 16 and 17 which form junctions $J_1$ and $J_2$. This is achieved by ensuring that the impurity concentrations of one of the regions 16, 17 forming the junction $J_3$ has a higher impurity concentration than at least one of the regions 14, 15 forming the junction $J_1$. Thus, for example, it would be possible to increase the impurity concentration of region 14 until it was of n+ and this would have the advantage of making region 13 unnecessary. Furthermore, it can be seen from FIGS. 2 and 3 that the breakdown voltage of the diode is affected by the separation of junctions $J_1$ and $J_2$ and, since this is fixed by the construction of the diode, it means that the breakdown voltage is relatively insensitive to temperature changes. In known constant-voltage diodes, such as Zener diodes, the breakdown voltage typically shows a strong temperature dependence.

It should also be noted that the polarities of the semiconductor regions may be reversed from those shown in FIG. 1.

The basic operation of a constant-voltage diode being a first embodiment of the present invention has thus been explained. However, the advantages of the present invention can also be achieved by providing a plurality of basic structures, as shown in e.g. FIGS. 2 and 3, within the same semiconductor pellet. This increases the area where the current flows (i.e., the area by the respective superposed regions when the n+ type semiconductor region 17 is projected on the pair of principal surfaces 11, 12). This provides a greater current capacity at the time of breakdown.

Figure 5:
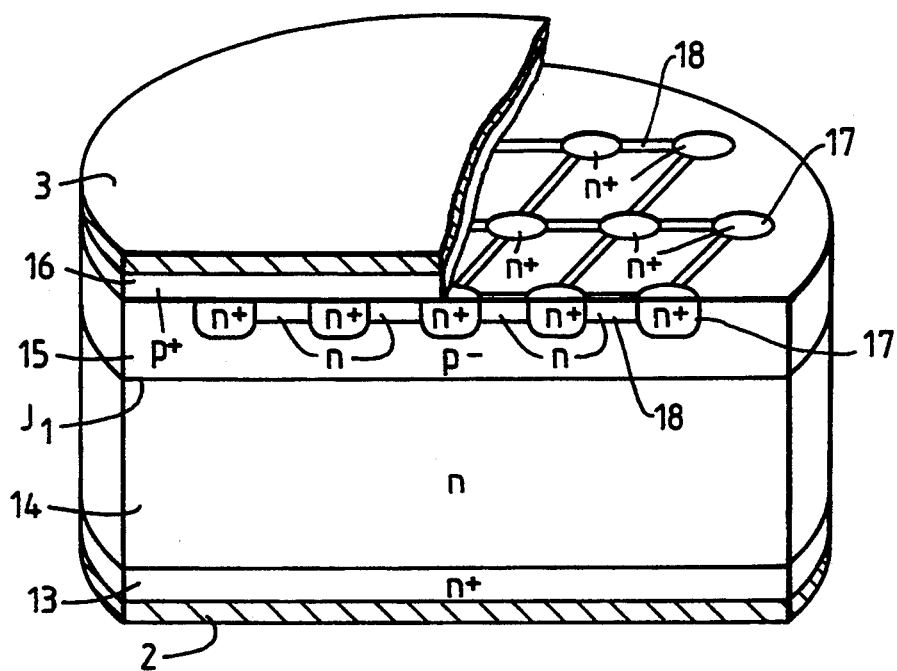
FIG. 5 is a schematic sectional view through a constant-voltage diode being a second embodiment of the present invention.

FIG. 5 illustrates another embodiment having a structure in which the current capacity at the time of breakdown of a constant-voltage diode according to the present invention is increased further. In this structure, the semiconductor substrate 1 has a large area, and a plurality of n+ type semiconductor regions 17 we provided in the substrate 1. Linear n-type semiconductor regions 18 having an impurity concentration lower than that of the n+ type semiconductor regions 17, but preferably higher than that of the p-type semiconductor region 15, interlink the n+ type semiconductor regions 17. The n-type semiconductor regions 18 are formed between the p+ type semiconductor region 16 and the p-type semiconductor region 15. With this structure, the current capacity at the time of breakdown may be increased in proportion to the number of n+ type semiconductor regions 17 since each provides a constant-voltage diode as shown in FIG. 1.

Moreover, the provision of the n-type semiconductor region 18 to interlink the n+ type semiconductor regions 17 makes it possible for the plurality of n+ type semiconductor regions 17, that have been in a floating state, to have the same potential when the depletion layer expanding from the pn junction $J_1$ into the p-type semiconductor region 15 comes into contact with the depletion layer in a state of thermal equilibrium existing at the pn junction $J_2$. Therefore, even though a number of breakdown areas are provided, such Zener or avalanche breakdown may be caused uniformly at a number of places within the semiconductor substrate 1.

Figure 6:
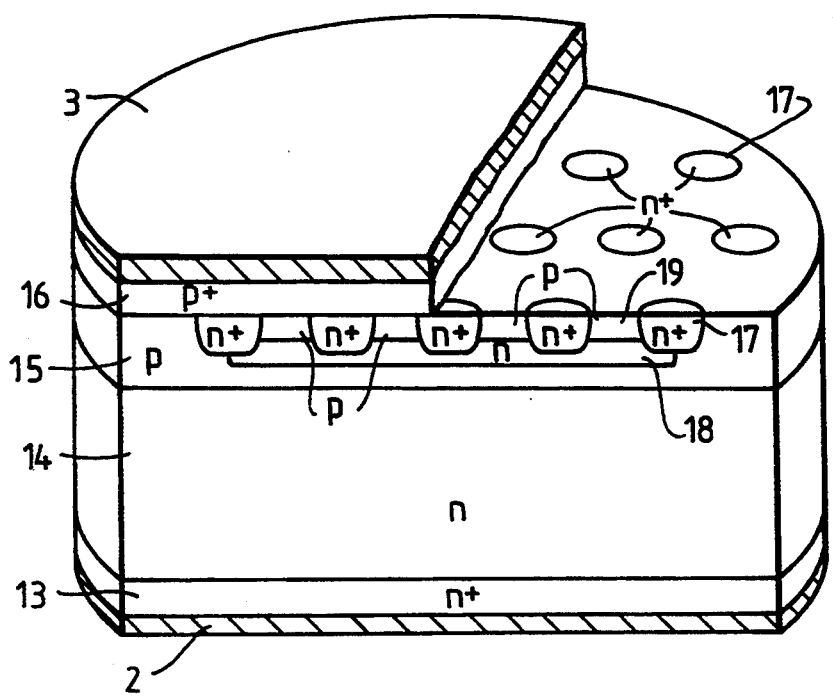
FIG. 6 is a sectional view of a constant-voltage diode being a modification of the diode of FIG. 5.

FIG. 6 illustrates a modification of the embodiment of FIG. 5, in which the n-type semiconductor region 18 interlink the n+ type semiconductor regions 17 of the constant-voltage diode shown in FIG. 5 are formed separately from the p+ type semiconductor region 16 within the p-type semiconductor region 15. With this structure, the n-type semiconductor region 18 comes into contact with the depletion layer. This ensures that the plurality of n+ type semiconductor regions 17 have exactly the same predetermined potential when the depletion layer expanding from the pn junction $J_1$ into the p-type semiconductor region 15 comes in contact with the depletion layer existing in a state of thermal equilibrium at the pn junction $J_2$. Zener or avalanche breakdown may consequently be caused at a number of places within the semiconductor substrate 1. Therefore, the operation at the time of breakdown is uniform, so that the current capacity is significantly increased.

Any ordinary diode, that is, a diode which does not have the n+ type semiconductor region 17 having a floating potential which a reverse voltage has not been applied thereto, has a reverse voltage current characteristic shown by the dotted line of FIG. 4. Thus avalanche breakdown occurs at point N. In this case, although the maximum intensity of the electronic field occurs substantially at the pn junction $J_1$, the breakdown voltage is not always determined uniformly. If an attempt is made to obtain a breakdown voltage of 3,000 V, for instance, the breakdown voltage will normally vary from the desired value by about 200 V to 500 V. The main reason for this is attributed to the fact that the impurity concentration and thickness of each semiconductor region tend to vary and that the intensity of the electric field in the neighbourhood of the pn junction exposed outside also tends to fluctuate, depending on the intensity and polarity of the charge in the surface protective film. One of the problems may arise if a large current is withheld from flowing at the time of breakdown. The current capacity can be increased according to the present invention without causing the problem stated above as breakdown occurs in the semiconductor substrate.

FIGS. 7(a) to 7(e) illustrate arrangements of the n+ type semiconductor region or regions 17 of constant-voltage diodes according to the present invention. The n+ type semiconductor region or regions 17 have a floating potential in a state of thermal equilibrium.

Figure 7A:
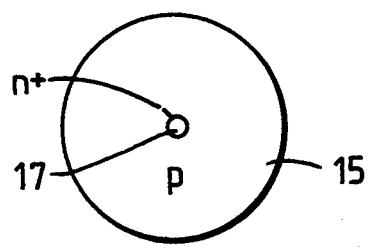
FIGS. 7(a) to 7(e) illustrate various layout geometries of constant-voltage diodes according to the present invention.
Figure 7B:
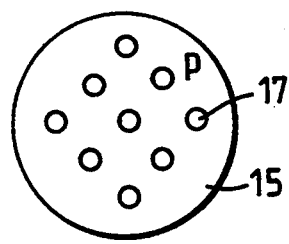
Figure 7C:
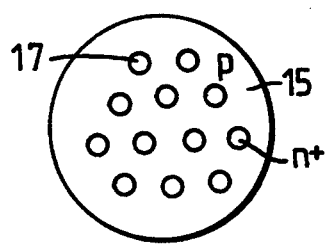
Figure 7D:
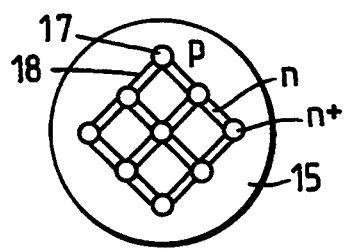
Figure 7E:
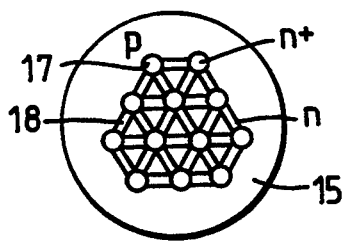

FIG. 7(a) illustrates the basic structure shown in FIG. 1; FIG. 7(b) illustrates the case with a plurality of semiconductor regions 17 in which the configuration enclosed by an imaginary line connecting the centers of the n+ type semiconductor regions 17 is square or rectangular (in plan view) FIG. 7(c) illustrates a similar case, but in which the configuration enclosed by an imaginary line connecting the centers of the n+ type semiconductor regions 17 is triangular. FIGS. 7(d) and (e) illustrate cases where n-type semiconductor layers 18 are added to the structures of FIGS. 7 (b) and (c) as in the embodiments of FIGS. 5 and 6.

Although the current at the time of breakdown is somewhat small in those cases where the configuration is square on rectangular, the advantage is that the forward current can be made greater. The forward current may also be somewhat small in the triangular case. However, it is still advantageous that the current at the time of breakdown can be made greater.

Figure 8:
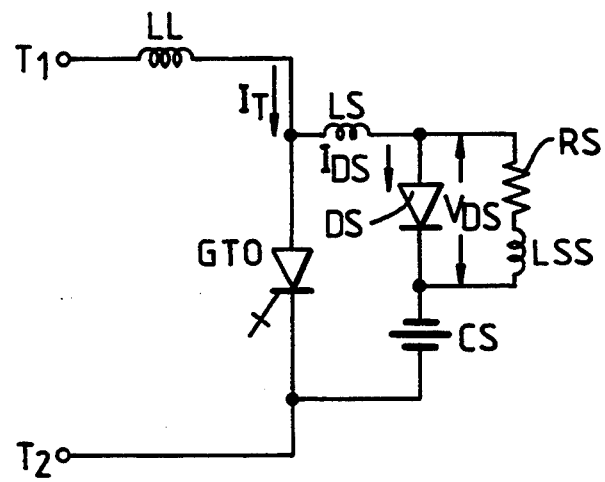
FIG. 8 is a diagram of a snubber circuit incorporating a GTO and a constant-voltage diode according to the present invention.

FIG. 8 shows the application of a constant-voltage diode according to the present invention to a snubber circuit of a gate turn-off thyristor (GTO). As shown in FIG. 8, a gate turn-off thyristor (GTO) is connected between terminals T1, T2, and a snubber diode DS and a snubber capacitor CS are connected in series and then connected to the gate turn-off thyristor GTO in parallel. In this case, a snubber resistor RS is connected to the snubber diode DS in parallel and a constant-voltage diode according to the present invention is employed as the snubber diode DS.

Figure 9:
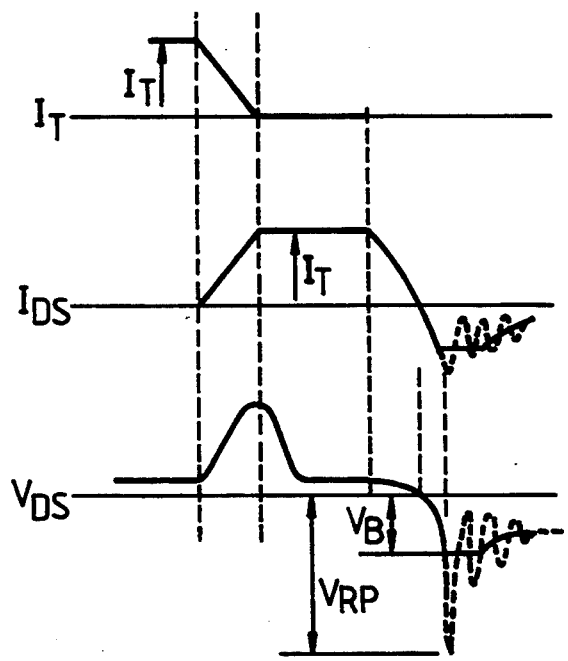
FIG. 9 is a graph illustrating the operation of the snubber circuit of FIG. 8.

When a constant-voltage diode according to the present invention is used as the snubber diode DS, the snubber diode DS and the gate turn-off thyristor GTO are prevented from being broken down. FIG. 9 shows the switching characteristics when the snubber diode DS is recovered. When the gate turn-off thyristor GTO is turned off, the current flowing through the gate turn-off thyristor GTO transfers to the snubber diode DS and the current flowing through the snubber diode DS then decreases to zero. The inductance of the wiring that exists in the snubber circuit at this time may cause a large spike voltage $V_{RP}$ as shown by a dotted line in FIG. 9, to be generated across the snubber diode DS. If the inductance of the circuit is large or if the current decreases sharply, the spike voltage may becomes higher than the breakdown voltage of the snubber diode DS. However, breakdown seldom occurs over the whole surface of the snubber diode DS but it is normally localized. This causes the snubber diode to generate heat locally and it may break down. By using a constant-voltage diode according to the present invention as the snubber diode, the spike voltage can be limited to a constant level and more current can flow at the time of breakdown. The waveforms of the current IDS and the voltage $V_{DS}$ in the snubber diode are thus improved as shown by the straight lines in FIG. 9, in contrast to the behaviour of a known diode shown by the dotted lines of FIG. 9. The voltage and the current tend to decrease slowly with the passage of time. As a result, not only the snubber diode but also the gate turn-off thyristor GTO may be operated with safety and prevented from being broken down.

Figure 10:
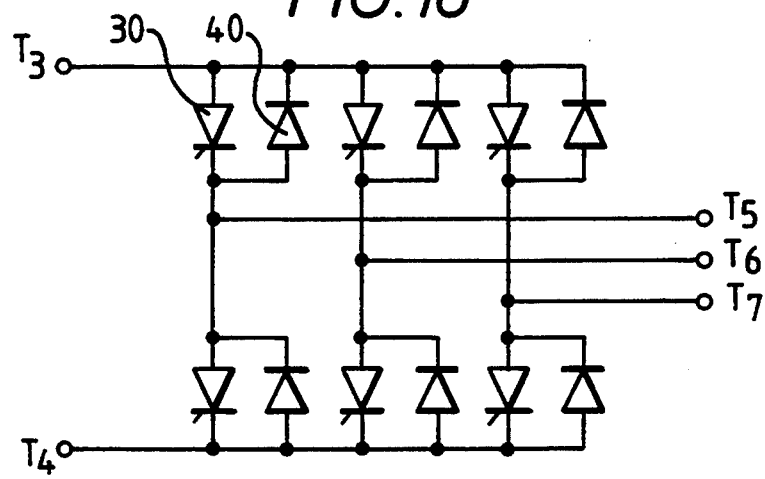
FIG. 10 is a voltage-control type inverter using constant-voltage diodes according to the present invention.
Figure 11:
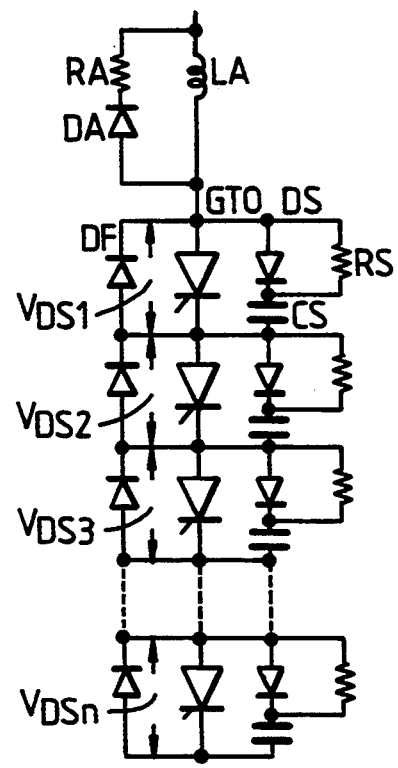
FIG. 11 illustrates a modification of part of the inverter of FIG. 10.

FIG. 10 shows the application of a constant-voltage diode according to the present invention to a voltage-control type inverter. As shown in FIG. 10, gate turn-off thyristors (GTO) 30, the number of which is equal to the number of a.c. phases, are connected in parallel between a pair of d.c. terminals $T_3$, $T_4$. Diodes 40 are respectively connected to the GTOs 30 in anti-parallel, to permit flow-back of load current. In this case, a.c. terminals $T_5$, $T_6$, $T_7$ are connected to respective series connections. For a large-capacity inverter, a plurality of GTO and diode elements are respectively connected in series for use as the GTO 30 and the diode 40 as shown in FIG. 11 because the voltage of a semiconductor element is normally lower than that required from the system. In the series circuit of FIG. 11, reference character LA represents an anode reactor, which operates to suppress the current rise factor di/dt when the GTO 30 is turned off and to suppress overcurrent at the time of failure of commutation on the part of GTO 30. A current limiting resistor RA is provided in an anode reactor circuit, a circulating diode DA is provided in the anode reactor circuit, a diode DF allows load current flow-back, a snubber diode DS, a snubber resistor CR and a snubber capacitor CS respectively are also provided, as gate circuits for turning on or off the GTO. Constant-voltage diodes according to the present invention are used as the snubber diodes DS, and/or the circulating diodes DA or DF. Hence, the circuit element is protected from overcurrent generated at the time of switching in the inverter.

Figure 12:
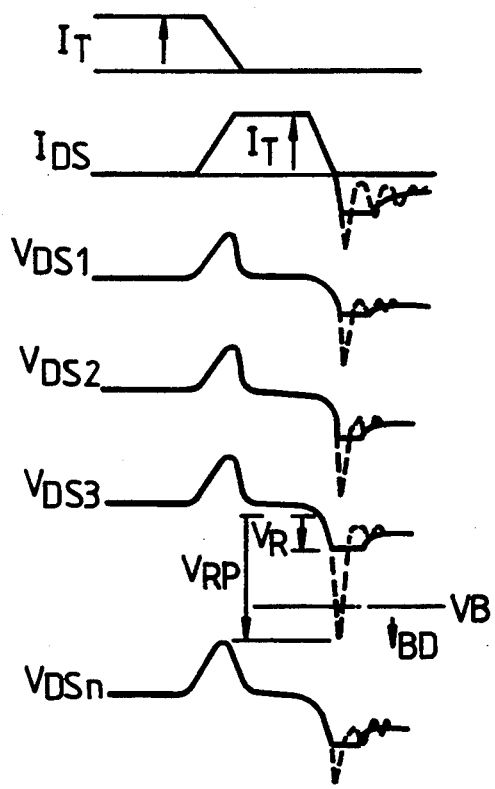
FIG. 12 shows graphs illustrating the operation of the voltage-control inverter of FIG. 10.

FIG. 12 shows recovery waveforms which occur when a constant-voltage diode according to the present invention is applied to those GTO snubber diodes thus connected in series. When a load current $I_T$ is turned off, the current transfers to the snubber diode and recovers a predetermined period of time after. At this time, the spike voltage VRP shown by the dotted line, or a ringing phenomenon, may occur in each snubber diode because of the inductance of the wiring in the gate circuit. If the number of series connections increases, it is difficult to ensure that the inductance of the wiring in every snubber circuit is equal. As the intensity of the spike voltage in the respective snubber circuits thus tends to vary, some of them may exceed the breakdown voltage of the element. A snubber circuit with a spike voltage exceeding the breakdown voltage generates heat and consequently tends to break down.

In the arrangement of FIG. 12, but in which a conventional diode is employed, a high spike voltage develops in the third snubber diode, for example. When such a conventional snubber diode is used, a spike voltage $V_{RP}$ greater than the breakdown voltage inherent to the element is applied to the snubber diode. Consequently, the snubber diode breaks down. The use of a constant-voltage diode according to the present invention makes it possible to control the spike voltage in such a way as to keep the voltage at a predetermined high value. Therefore, the ringing phenomenon of the voltage and current, arising when the snubber diode is recovered, can be prevented and the waveform appears to exhibit soft recovery.

When a conventional diode is used, the spike voltage shown by the dotted line in FIG. 12 varies from 2,500 V to 4,700 V and consequently tends to cause breakdown. When a constant-voltage diode of 3,000 V class according to the present invention is employed, it can be seen that no spike voltage develops and this stable operation of the inverter results. The application of a constant-voltage diode of the present invention to GTOs connected in series demonstrates a great effect to safety of operation of an inverter, without breakdown of elements occurring.

Figure 13:
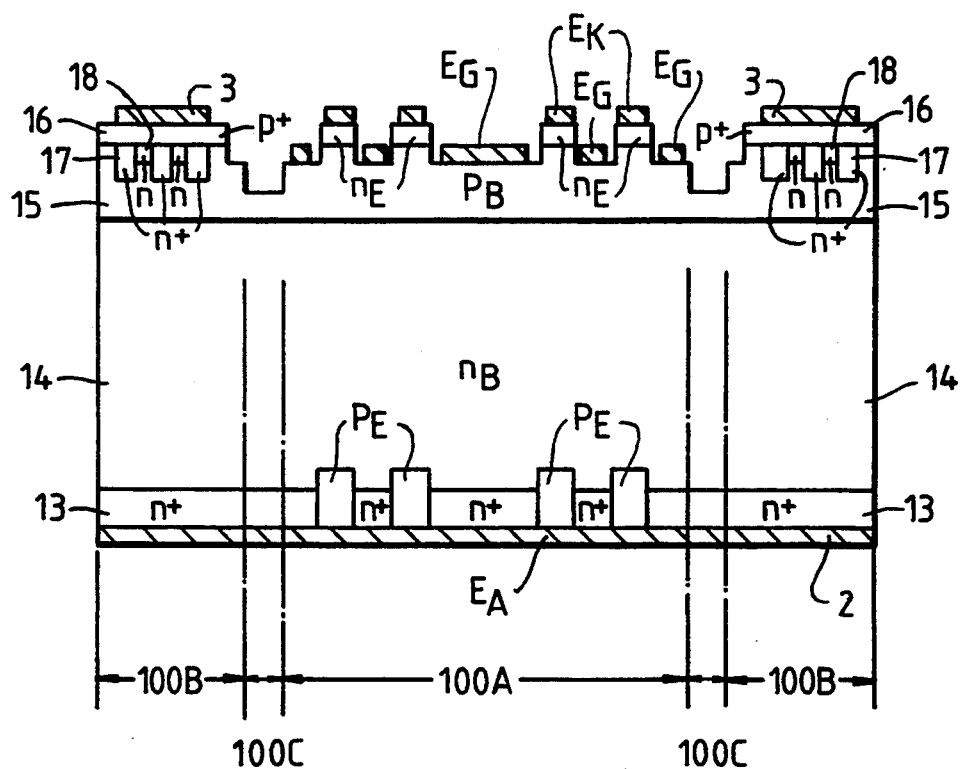
FIG. 13 is a schematic sectional view of a reverse conductive GTO which is integral with a constant-voltage diode according to the present invention.

FIG. 13 illustrates another embodiment of the present invention in which reversely conductive GTO incorporating a constant-voltage diode and a GTO in anti-parallel is applied to the inverter of FIG. 10. FIG. 13 shows a semiconductor substrate 100, with a GTO portion 100A located at the center thereof. Constant-voltage diode portions 100B are located at the periphery of the semiconductor substrate, and partitions 100C separate the GTO portion 100A from the constant-voltage diode portions 100B. In the constant-voltage diode portion 100B, components the same or similar to those the embodiment of FIG. 5 are designated by the same reference numerals. The GTO portion 100A comprises an n base region $n_{B'}$, p emitter region $P_{E'}$ adjacent to a first principal surface and an n base region $n_B$, a short-circuiting n+ region adjacent the first principal surface, the n base region $n_B$ and the p emitter region $p_E$, a p base region $p_{B'}$ adjacent the second principal surface and n base region $n_B$, a plurality of n emitter region $n_{E'}$ adjacent the second principal surface and the p base region $p_B$, an anode electrode $E_A'$ in contact with the p emitter region $p_E$ and the short-circuiting n+ region, gate electrodes $E_G'$ in contact with the p base region $p_B$, and cathode electrodes $E_K$ in contact with n emitter regions $n_E$. The anode electrode $E_A$ of the GTO portion 100A and the cathode electrode 2 of the constant-voltage diode portion 100B are integral as shown in FIG. 13. Although the cathode electrodes $E_K$ of the GTO portion 100A and anode electrodes 3 of the constant-voltage diode portion 100B are separated as shown in FIG. 13, they are electrically connected, in use.

The operation of such a reversely conductive GTO will now be described. When the polarity of the voltage applied between the anode electrode $E_A$ and the cathode electrodes $E_K$ of the GTO portion 100A is inverted from that corresponding to the forward direction with respect to the constant-voltage diode portion, and thus corresponds to the forward direction with respect to the GTO portion (in the reverse direction with respect to the constant-voltage diode), a high reverse voltage is applied to the constant-voltage diode. At this time, a high spike voltage may be generated because of the inductance of the wiring. When an ordinary high-voltage diode is used, the current concentration produced in a narrow junction area results in lowering heat radiation and thus readily causes breakdown. By using a constant-voltage diode according to the present invention to the reversely conductive GTO, on the other hand, the diode portion breaks down uniformly. Since the spike voltage is limited to a constant high voltage value as described with reference to the snubber diode, elements are prevented from breaking down, thereby ensuring that they operate with safety. Furthermore, since the GTO portion 100A and the constant-voltage diode portion 100B are combined, the inductance of the wiring is made lower than that which results when they are separated and externally connected. This also reduces the spike voltage.

Figure 14:
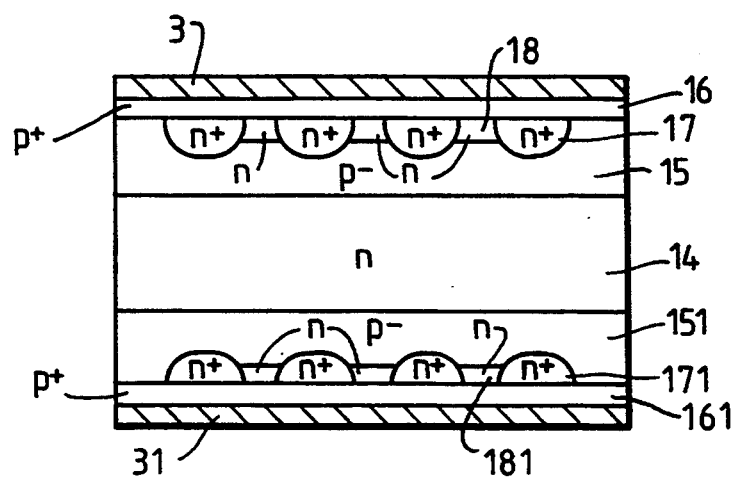
FIG. 14 is a bi-directional constant-voltage diode of an embodiment of the present invention.

FIG. 14 illustrates another embodiment of the present invention in which the constant-voltage diode can be operated bidirectionally. In FIG. 14, parts and regions corresponding to parts or regions of the embodiments of FIGS. 1 and 5 are indicated by the same reference numerals. This embodiment differs from those of FIGS. 1 and 5 in that there is a p-type semiconductor region 151, an n+ type semiconductor region 171, n-type semiconductor regions 181 and a p+ type semiconductor region 161 between the n-type semiconductor region 14 and the principal surface 11. Thus, the constant- voltage diode is symmetrical in construction about the n-type semiconductor region 14. An electrode 31 is in ohmic contact with the p+ type semiconductor region 161. The principle of the operation that allows constant voltage to be maintained bidirectionally is such that, as described with reference to FIGS. 2, 3 and 4, when a voltage is applied which makes the electrode 31 positive and the electrode 3 negative, the pn junction $J_1$ (formed by the n-type semiconductor region 14 and the p-type semiconductor region 15) is subjected to an electric field. As the voltage thus applied increases, the depletion region expanding into the p-type semiconductor layer 15 reaches the n+ type semiconductor region 17 at a predetermined voltage. When the intensity of the electric field at the pn junction $J_3$ (formed by the p+ type semiconductor region 16 and the n+ type semiconductor regions 17) exceeds that corresponding to the Zener or avalanche breakdown voltage, the voltage is no longer applied and a constant voltage is maintained bidirectionally. This operation also occurs if the voltage polarity is reversed.

Figure 15:
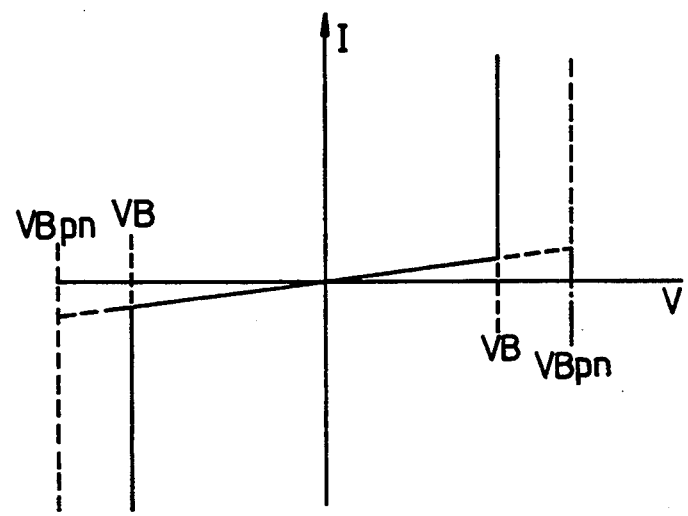
FIG. 15 illustrates the current/voltage characteristic of the constant-voltage diode of FIG. 14.

FIG. 15 shows the characteristics of the bidirectional constant-voltage diode of FIG. 14 according to the present invention. In FIG. 15, dotted lines indicate the characteristics of a conventional diode for maintaining elements in a bidirectional state, which does not have the n+ type semiconductor regions 17, 171 and the n-type semiconductor regions 18, 181 in the floating state. The value of the breakdown voltage VBpn tends to vary significantly, and localized heat generation occurs. Hence, there is the disadvantage is that the elements are easily broken down. The use of a bidirectional constant-voltage diode according to the present invention permits bidirectional breakdown to occur at a constant voltage value VB and a large current value at the time of breakdown can be obtained. Hence, the operation is stable.

Figure 16:
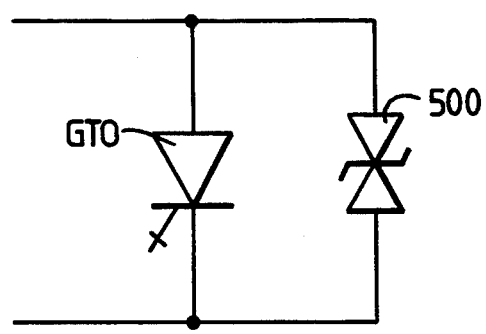
FIG. 16 is a circuit diagram illustrating the use of the constant-voltage bi-directional diode of FIG. 14 as protection for a GTO.

FIG. 16 illustrates the application of the bidirectional constant-voltage diode of FIG. 15 to overvoltage protection of a functional element. If a bidirectional constant-voltage diode 500 is connected in parallel to a GTO as a functional element, the bidirectional constant-voltage diode operates to prevent the voltage exceeding a certain level from being applied to the GTO even though an overvoltage that may otherwise break down the GTO may be generated for various reasons. The GTO is thus kept from being broken down because of such overvoltage.

Figure 17:
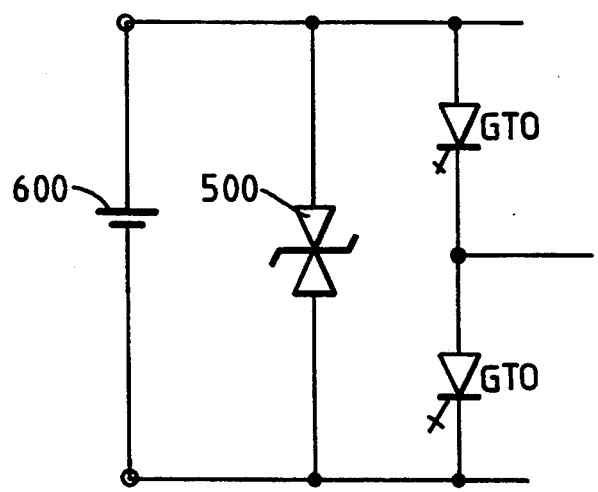
FIG. 17 illustrates a modification of the circuit of FIG. 16 for two GTOs.

FIG. 17 illustrates a further application of the bidirectional constant-voltage diode of FIG. 18 to overvoltage protection of an apparatus. Malfunction due to noise or voltage fluctuations in a power system may cause overvoltage to be applied to a power converter such as an inverter. FIG. 17 illustrates only part of the voltage control type inverter shown in FIG. 10.

When power converters are operated, the voltage value of the power supply of a particular converter may start to fluctuate, e.g. because of lightning. When an overvoltage is applied to the power supply side of the converter, switching elements of the converter may break down. For this reason, a bidirectional constant-voltage diode 500 is connected in parallel to the power supply of the converter as shown in FIG. 17, so that even though overvoltage may be applied to the power supply side 600 of the converter, voltages exceeding a certain level and prevented from being applied to the converter. The converter is thus protected from overvoltage and therefore breaking down. When the power supply voltage with used is 6,000 V, a bidirectional constant-voltage diode according to the present invention with a withstand voltage of 6,600 V has been used to ensure that the operation is performed with stability, since no voltage exceeding 6,600 V is applied to the converter.

FIGS. 18(a) to 18(f) illustrate a process for producing the constant-voltage diode of FIG. 5 according to the present invention.

Figure 18A:
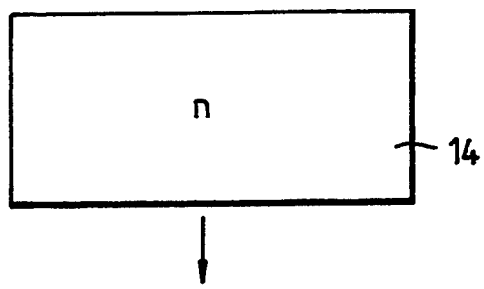
FIGS. 18(a) to 18(f) illustrate steps in a process for producing the embodiment of the constant-voltage diode shown in FIG. 5.
Figure 18B:
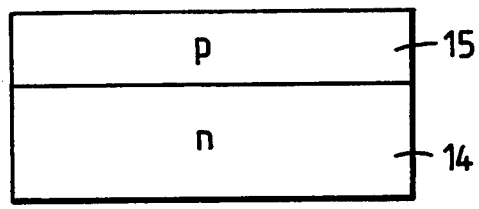
Figure 18C:
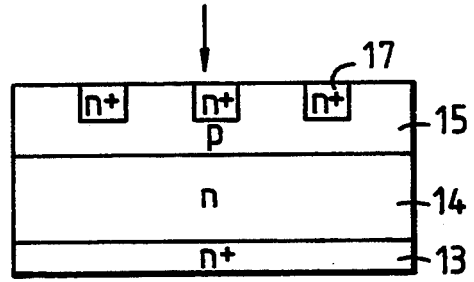

First, as shown in FIG. 18(a), an n-type semiconductor substrate 14 is provided, with resistivity of $15-10\times10^3$ μm. Then, as shown in FIG. 18(b) a diffusion region 15 is formed on the substrate 14, the diffusion region 15 being about 65 μm thick with a surface impurity concentration of about $1\times10^{21}$ m$^{-3}$ the p-type impurity being Al. A plurality of n+ type semiconductor regions 17 are formed by selectively diffusing phosphorus into the diffusion region 15 and an n+ type semiconductor region 13 is formed over the whole undersurface as shown in FIG. 18(c). More specifically, a silicon dioxide film about 1 to 2 μm thick is formed by plasma CVD on the surface. Windows 30 μm wide are formed by selective photoetching at intervals of about 100 μm and then phosphorus (P) diffusion using phosphorus hypochlorite is applied to the whole surface of the semiconductor substrate 14 to form a diffusion region about 20 μm deep with a surface impurity concentration of about $1\times10^{26}$ m$^{-3}$.

Figure 18D:
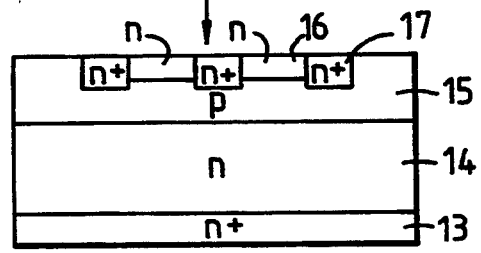
Figure 18E:
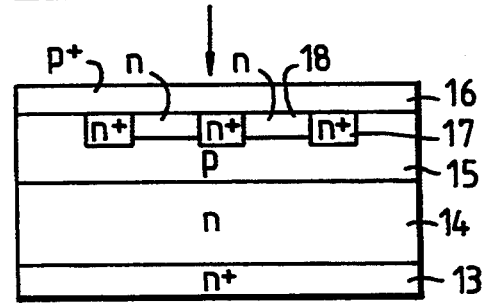

A different process may be employed for forming the n-type diffusion regions on the surface and undersurface of the substrate 14 respectively as occasion demands. Subsequently, phosphorus is selectively diffused in the diffusion region 15 to form linear n-type semiconductor regions 18 for interlinking the n+ type semiconductor regions 17 as shown in FIG. 18(d). One specific process for this purpose comprises the steps of forming a silicon dioxide film about 1 to 2 μm thick on the surface by plasma CVD, forming windows 10 μm wide by selectively removing the film, implanting phosphorus P ions with a surface impurity concentration of about $1\times10^{22}$ m$^{-3}$ to $1\times10^{25}$ m$^{-3}$. Then, a semiconductor region about 2 to 10 μm deep is formed by heat treatment, the surface cleaned by removing the oxide film using fluoric acid or the like and then forming a p+ type semiconductor layer 16 about 5 μm thick is formed on the cleaned surface using an epitaxial method as shown in FIG. 18(e). The p+ type semiconductor region 16 contains p-type impurities with a concentration of about $1\times10^{25}$ m$^{-3}$ to $1\times10^{26}$ m$^{-3}$. When it is difficult to form the p+ type semiconductor region 16 with high impurity concentration using only an epitaxial method, the process steps may include forming an epitaxial growth layer with an impurity concentration of about $1\times10^{20}$ m$^{-3}$ to $1\times10^{22}$ m$^{-3}$ to increase the impurity concentration of the epitaxial layer by diffusing boron using normal boron nitride film.

Figure 18F:
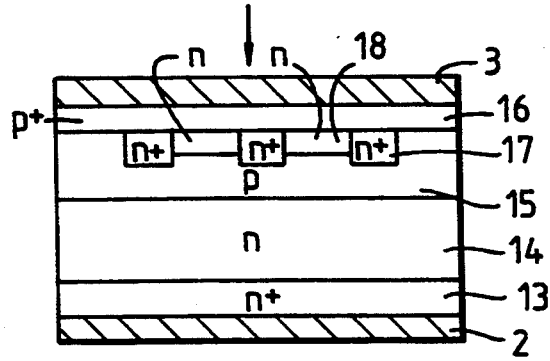

Lastly, an anode electrode 3 and a cathode electrode 2 about 5 to 15 μm thick are respectively formed on the p$^+$ type semiconductor region 16 and the n$^+$ type semiconductor region 13 by electron beam evaporation or resistance heating to complete the constant-voltage diode, as shown in FIG. 18(f). The constant-voltage diode thus obtained has reverse withstand voltage ranging from 3,000 V to 3,400 V.

FIG. 19(a) to 19(g) illustrate a process for producing the constant-voltage diode of FIG. 6 according to the present invention.

Figure 19A:
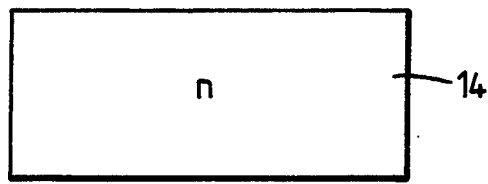
FIGS. 19(a) to 19(g) illustrates steps in a process for producing the embodiment of the constant-voltage diode shown in FIG. 16.
Figure 19B:
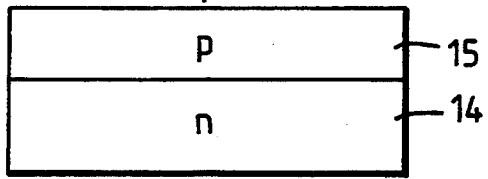
Figure 19C:
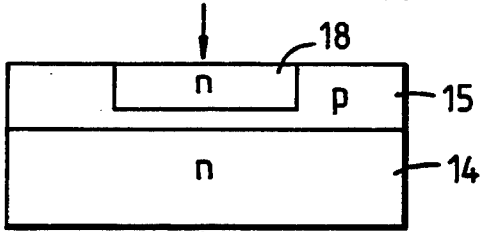
Figure 19D:
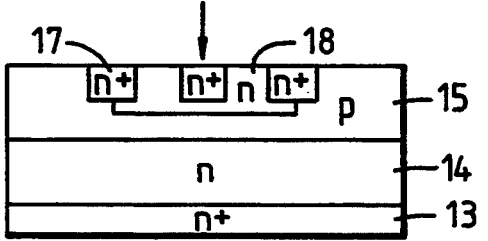
Figure 19E:
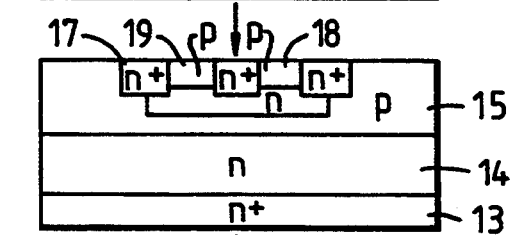

First, as shown in FIG. 19(a) an n-type semiconductor substrate 14 is provided, with a resistivity of 15−50×10$^3$ Ω.m. Then, as shown in FIG. 19(b), a diffusion region 15 is formed on the substrate 14, the diffusion region 15 being about 65 μm thick with a surface impurity concentration of about $1\times10^{21}$ m$^{-3}$ the p-type impurity being A1. Phosphorus (P) ions with a surface impurity concentration of about $1\times10^{21}$ m$^{-3}$ to $1\times10^{24}$ m$^3$ are implanted in the diffusion region 15 by heat treatment to form an n-type semiconductor region 18 about 20 to 30 μm deep, as shown in FIG. 19(c). Phosphorus is then selectively diffused in the diffusion region 15 and the n-type semiconductor region 18 to form n$^+$ type semiconductor regions 17 simultaneously with an n$^+$ type semiconductor region 13 on the whole undersurface as shown in FIG. 19(d). More specifically, a silicon dioxide film about 1 to 2 μm thick is formed by plasma CVD on the surface. Windows 30 μm wide are formed by selective photoetching at intervals of about 100 μm and then phosphorus (P) diffusion using phosphorus hypochlorite is applied to the whole surface of the semiconductor substrate 14 to form a diffusion region about 10 to 25 μm deep with a surface impurity concentration of about $1\times10^{26}$ m$^{-3}$ to $1\times10^{27}$ m$^{-3}$.

Figure 19F:
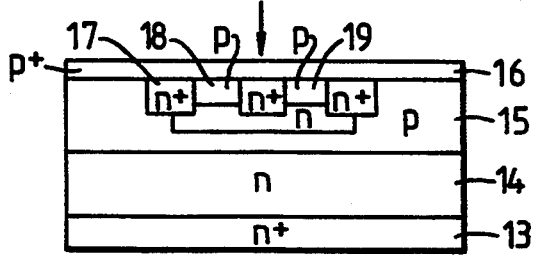

A different process may be employed for forming the n-type diffusion regions on the surface and undersurface of the substrate respectively as occasion demands. Subsequently, B (boron) doped p-type semiconductor regions 19 about 5 to 15 μm thick with a surface impurity concentration of about $1\times10^{21}$ m$^{-3}$ to $1\times10^{25}$ m$^{-3}$ are formed on the surface of n-type semiconductor region 18 by ion implantation followed by heat treatment as shown on (FIG. 19(e)). The surface is then cleaned by removing the oxide film using fluoric acid or the like and a p$^+$ type semiconductor region 16 about 5 μm thick is formed on the cleaned surface using the epitaxial method as shown in FIG. 19(f), the p$^+$ type semiconductor region 16 contains p-type impurities with a concentration of about $1\times10^{25}$ m$^{-3}$ to $1\times10^{26}$ m$^{-3}$. When it is difficult to form the p$^+$ type semiconductor region 16 with a high impurity concentration using only an epitaxial method, the process steps may include forming an epitaxial growth layer with an impurity concentration of about $1\times10^{20}$ m$^{-3}$ to $1\times10^{22}$ m$^{-3}$, and to increase the impurity concentration of the epitaxial layer by diffusing boron using a normal boron nitride film.

Figure 19G:
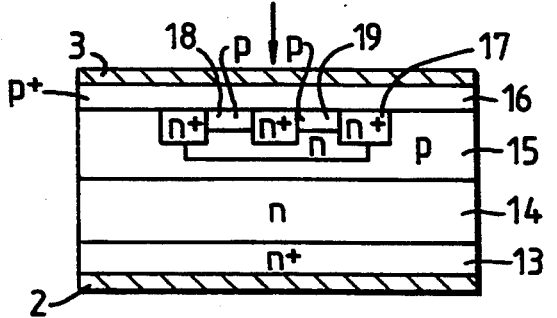

Lastly, an anode electrode 3 and a cathode electrode 2 about 5 to 15 μm thick are respectively formed on the p$^+$ type semiconductor region 16 and the n$^+$ type semiconductor region 13 by electron beam evaporation or resistance heating to complete the constant-voltage diode, as shown in FIG. 19(g). The constant-voltage diode thus obtained has reverse withstand voltage ranging from 3,000 V to 3,400 V.

FIGS. 20(a) to 20(g) illustrate another process of producing the constant-voltage diode of FIG. 6 according to the present invention.

Figure 20A:
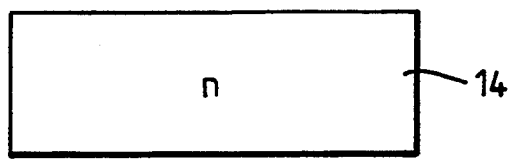
FIGS. 20(a) to 20(g) illustrate another process for providing the constant-voltage diode shown in FIG. 6.
Figure 20B:
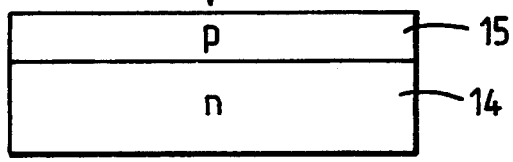
Figure 20C:
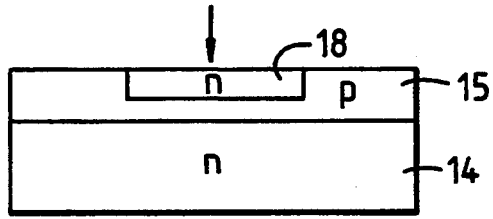
Figure 20D:
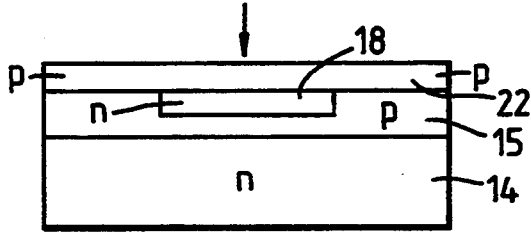
Figure 20E:
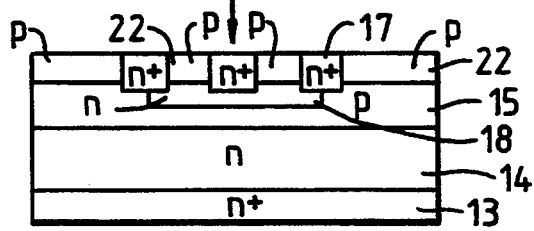

First, as shown in FIG. 20(a), an n-type semiconductor substrate 14 is provided with a resistivity of 15 to $50\times10^3$ μm. Then, as shown in FIG. 20(b), a diffusion region 15 is formed on the substrate 14, the diffusion region 15 being 65 μm thick with a surface impurity concentration of about $1\times10^{21}$ m$^-$ the p-type impurity being A1. Phosphorus (p) ions with a surface impurity concentration of about $1\times10^{<}$m$^{-3}$ to $1\times10^{24}$ m$^{-3}$ are implanted in the diffusion region 15 by heat treatment to form an n-type semiconductor region 18 about 10 to 30 μm deep, as shown in FIG. 20(c). Then a p-type semiconductor layer 22 about 5 to 20 μm thick with an impurity concentration of $1\times10^{21}$ m$^{-3}$ to $1\times10^{24}$ m$^{-3}$ is formed on the n-type semiconductor region 18 and the diffusion region 15 using an epitaxial method, as shown in FIG. 20(d). Phosphorus is selectively diffused so as to pass through the p-type semiconductor region 22 to form a plurality of n$^+$ type semiconductor regions 17 and an n$^+$ type semiconductor layer 13 is formed (e) on the whole undersurface as shown in FIG. 20(e). More specifically, a silicon dioxide film about 1 to 2 μm thick is formed by plasma CVD on the surface. Windows 30 μm wide are formed by selective photoetching at intervals of about 100 μm and then phosphorus (p) diffusion using phosphorus hypochlorite is applied to the whole surface of the semiconductor substrate to form a diffusion layer about 10 to 25 μm deep with a surface impurity concentration of about $1\times10^{26}$ m$^{-3}$ to $1\times10^{27}$ m$^{-3}$. A different process may be employed for forming the n-type diffusion regions on the surface and undersurface of the substrate respectively as occasion demands.

Figure 20F:
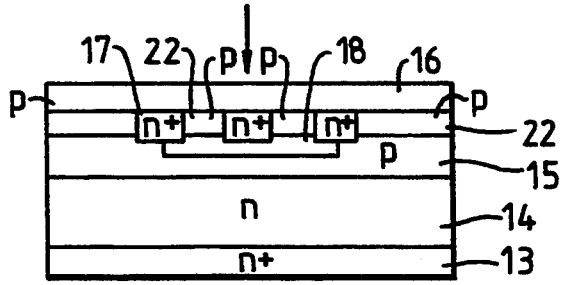

Subsequently, the surface is cleaned by removing the oxide film using fluoric acid or the like and a p$^+$ type semiconductor region 16 about 5 μm thick is formed as shown in FIG. 20(f) on the cleaned surface through the epitaxial method. The p$^+$ type semiconductor region 16 contains p-type impurities with a concentration of about $1\times10^{25}$ m$^{-3}$ to $1\times10^{26}$ m$^{-3}$. When it is difficult to form the p$^+$ type semiconductor region 16 with high impurity concentration uses only an epitaxial method, the process steps may include forming an epitaxial growth layer with an impurity concentration of about $1\times10^{20}$ m$^{-3}$ to $1\times10^{22}$ m$^{-3}$, and to increase the impurity concentration of the epitaxial layer by diffusing boron using a normal boron nitride film.

Figure 20G:
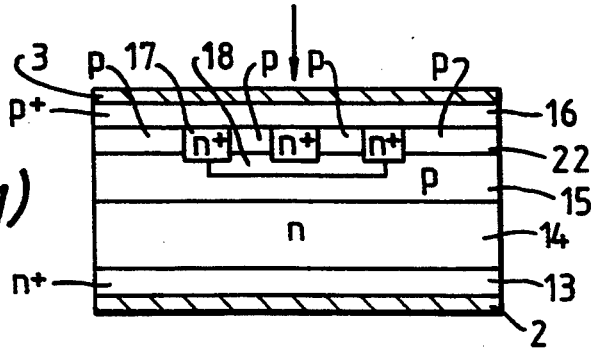

Lastly, an anode electrode 3 and a cathode electrode 2 about 5 to 15 μm thick are respectively formed on the p$^+$ type semiconductor region 16 and the n$^+$ type semiconductor region 13 by electron beam evaporation or resistance heating to complete the constant-voltage diode, as shown in FIG. 20(g). The constant-voltage diode thus obtained has reverse withstand voltage ranging from 3,000 V to 3,400 V.

FIGS. 21(a) to 21(f) illustrate a process for producing the constant-voltage diode of FIG. 14 according to the present invention.

Figure 21A:
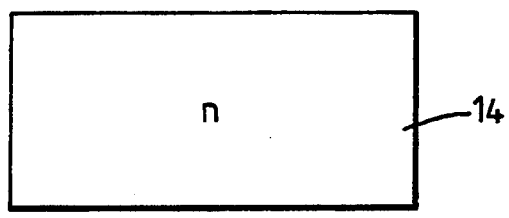
FIGS. 21(a) to 21(f) illustrates steps in a process for producing the constant-voltage diode shown in FIG. 14.
Figure 21B:
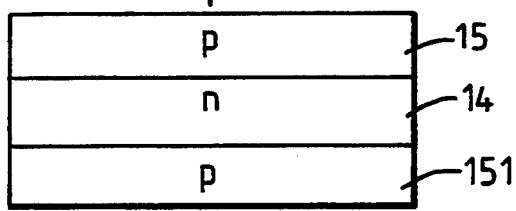
Figure 21C:
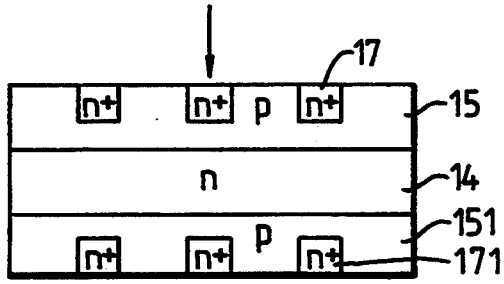
Figure 21D:
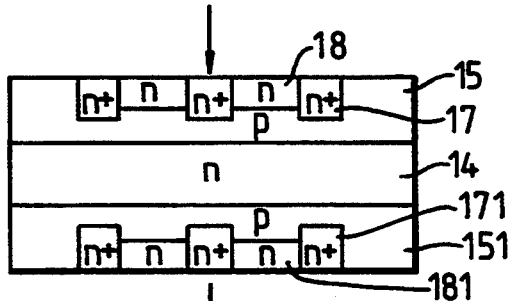
Figure 21E:
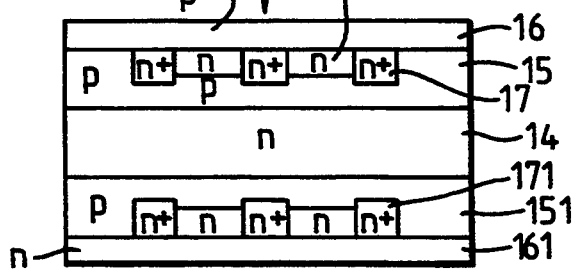

First, as shown in FIG. 21(a), an n-type semiconductor substrate 14 is provided, with a resistivity of $35\times10^3$ μm. Then, as shown in FIG. 21(b) diffusion regions 15, 151 about 70 μm thick are formed on the upper and lower surface of the substrate 14 with a surface impurity concentration of about $1\times10^{21}$ m$^{-3}$, the p-type impurity being A1, as shown in FIG. 21(c). Phosphorus is diffused in the diffusion regions 15, 151 to form (c) n+ type semiconductor regions 17, 171. More specifically, silicon dioxide films about 1 to 2 μm thick are respectively formed on the surface and the undersurface by plasma CVD. Windows 30 μm wide are formed by selective photoetching at intervals of about 100 μm and then phosphorus (P) diffusion using phosphorus hypochlorite is applied to the whole surface of the semiconductor substrate 14 to form a diffusion region about 20 μm deep with a surface impurity concentration of about $1 \times 10^{26}$ m$^{-3}$ to $1 \times 10^{27}$ m$^{-3}$. Subsequently, phosphorus is selectively diffused in the diffusion regions 15, 151 to form n-type semiconductor regions 18, 181 as shown in FIG. 21(d). A specific process for the purpose comprises the steps of forming silicon dioxide films about 1 to 2 μm thick on the upper and lower surfaces by plasma CVD, forming windows 10 μm wide by selectively removing the film, implanting phosphorus (P) ions with a surface impurity concentration of about $1 \times 10^{23}$ m$^{-3}$ to $1 \times 10^{25}$ m$^{-3}$ forming semiconductor about 2 to 10 μm deep using heat treatment, cleaning the surface by removing the oxide film using fluoric acid or the like and then forming p+ type semiconductor regions 16, 161 about 5 μm thick on the cleaned surface using an epitaxial method, as shown in FIG. 21(e). The p+ type semiconductor layer 16 contains p-type impurities with a concentration of about $1 \times 10^{25}$ m$^{-3}$ to $1 \times 10^{26}$ m$^{-3}$. When it is difficult to form the p+ type semiconductor layers 16, 161 with high impurity concentration using only an epitaxial method, the process steps may include forming epitaxial growth regions with an impurity concentration of about $1 \times 10^{20}$ m$^{-3}$ to $1 \times 10^{22}$ m$^{-3}$ to increase the impurity concentration of the epitaxial regions by diffusing boron using a normal boron nitride film.

Figure 21F:
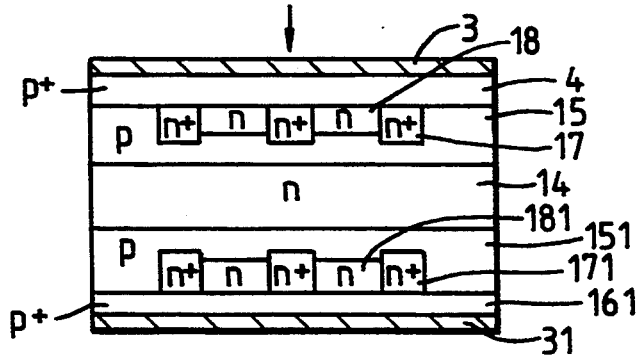

Lastly, electrodes 3, 31 about 5 to 15 μm thick are respectively formed on the p+ type semiconductor regions 16, 161 by electron beam evaporation or resistance heating to complete the constant-voltage diode, as shown in FIG. 21(f). The constant-voltage diode thus obtained has reverse withstand voltage ranging from 6,000 V to 7,000 V.

Although the above description referred to the use of aluminum and boron as p-type impurities in the process of producing the constant-voltage diodes according to the present invention, gallium may also be used. The n-type impurities were phosphorus, but arsenic and antimony may also be used. Use can also be made of semiconductor elements such as bipolar transistors, MOS transistors, insulated gate bipolar transistors, static induction transistors, static induction thyristors and the like in addition to the GTO as switching elements.

Although embodiments of the present invention, have been described above, the invention is not limited by any of the details of description and that various changes and modifications may be made in the invention without departing from the spirit and scope thereof.

With the present invention, high- and constant-voltage diodes demonstrating stable constant-voltage characteristics are obtainable according to the present invention and when applied to diodes in snubber circuits of semiconductor switching elements and those in power converters such as invertors, circuit elements are prevented from breaking down because of overvoltage resulting from the switching of semiconductor switching elements. Reliable snubber circuits and power converters are thus attained.

What is claimed is:

1. A constant-voltage diode, comprising:
   a first semiconductor region of first conductivity type;
   a second semiconductor region of a second conductivity type, said second conductivity type being different from said first conductivity type, said first and second semiconductor regions contacting each other such as to form a first pn junction therebetween;
   a third semiconductor region of said second conductivity type contacting said second semiconductor region;
   a fourth semiconductor region of said first conductivity type contacting and being at least partially surrounded by said second semiconductor region; and
   first and second electrodes in electrical contact with said first and third semiconductor regions, respectively;
   wherein said third semiconductor region is interposed between said fourth semiconductor region and said second electrode to embed said fourth semiconductor region and separate it from the second electrode;
   wherein the impurity concentration of at least one of said first and second semiconductor regions is less than the impurity concentration of at least one of said third and fourth semiconductor regions.

2. A diode according to claim 1, wherein the impurity concentration of said second semiconductor region is less than the impurity concentration of both said third and fourth semiconductor regions.

3. A diode according to claim 1, wherein the impurity concentration of said first semiconductor region is less than the impurity concentration of both said third and fourth semiconductor regions.

4. A diode according to claim 1, wherein said fourth semiconductor region contacts said third semiconductor region such as to form a second pn junction therebetween.

5. A diode according to claim 1, wherein said fourth semiconductor region is wholly surrounded by said second semiconductor region.

6. A diode according to claim 1, having an additional semiconductor region of said first conductivity type between said first semiconductor region and said first electrode.

7. A constant-voltage diode, comprising:
   a first semiconductor region of a first conductivity type;
   a second semiconductor region of a second conductivity type, said second conductivity type being different from said first conductivity type, said first and second semiconductor regions contacting each other such as to form a first pn junction therebetween;
   a third semiconductor region of said second conductivity type contacting said second semiconductor region;
   a plurality of fourth semiconductor regions of said first conductivity type, each of said plurality of fourth semiconductor regions being at least partially surrounded by said second semiconductor region;
   first and second electrodes in electrical contact with said first and third semiconductor regions, respectively;

wherein said third semiconductor region is interposed between said fourth semiconductor regions and said second electrode to embed said fourth semiconductor regions and separate them from the second electrode;

wherein the impurity concentration of at least one of said first and second semiconductor regions is less than the impurity concentration of at least one of said third and said plurality of fourth semiconductor regions.

8. A diode according to claim 7, having an additional semiconductor region of said first conductivity type between said first semiconductor region and said first electrode.

9. A diode according to claim 7, having a plurality of further semiconductor regions of said first conductivity type interconnecting said plurality of fourth semiconductor regions, said plurality of further semiconductor regions having a lower impurity concentration than said plurality of fourth semiconductor regions.

10. A diode according to claim 9, wherein said plurality of further semiconductor regions contact said third semiconductor region.

11. A diode according to claim 9, wherein said plurality of further semiconductor regions are separated by parts of said second semiconductor region from said third semiconductor region.

12. A diode comprising:
a first semiconductor region of a first conductivity type;
a second semiconductor region of a second conductivity type, said second conductivity type being different from said first conductivity type, said first and second semiconductor regions contacting each other such as to form a first pn junction therebetween;
a third semiconductor region of said second conductivity type contacting said second semiconductor region;
a plurality of fourth semiconductor regions of said first conductivity type, each of said plurality of fourth semiconductor regions being at least partially surrounded by said second semiconductor region;
first and second electrodes in electrical contact with said first and third semiconductor regions, respectively;
wherein the impurity concentration of at least one of said first and second semiconductor regions is less than the impurity concentration of at least one of said third and said plurality of fourth semiconductor regions; and
a plurality of further semiconductor regions of said first conductivity type interconnecting said plurality of fourth semiconductor regions, said plurality of further semiconductor regions having a lower impurity concentration than said plurality of fourth semiconductor regions.

13. A diode according to claim 12, wherein said plurality of further semiconductor regions contact said third semiconductor region.

14. A diode according to claim 12, wherein said plurality of further semiconductor regions are separated by parts of said second semiconductor region from said third semiconductor region.

15. A constant-voltage diode, comprising:
a first semiconductor region of a first conductivity type;
a second semiconductor region of a second conductivity type, said second conductivity type being different from said first conductivity type, said first and second semiconductor regions contacting each other such as to form a first pn junction therebetween;
a third semiconductor region of said second conductivity type contacting said second semiconductor region;
a fourth semiconductor region of said first conductivity type contacting and being at least partially surrounded by said second semiconductor region; and
a fifth semiconductor region of said second conductivity type contacting said first semiconductor region and being spaced from said second semiconductor region;
a sixth semiconductor region of said second conductivity type contacting said fifth semiconductor region;
a seventh semiconductor region of said first conductivity type contacting and being at least partially surrounded by said fifth semiconductor region; and
first and second electrodes in electrical contact with said sixth and third semiconductor regions, respectively;
wherein said third semiconductor region is interposed between said fourth semiconductor region and said second electrode to embed said fourth semiconductor region and separate it from the second electrode;
wherein the impurity concentration of at least one of said first and second semiconductor regions is less than the impurity concentration of at least one of said third and fourth semiconductor regions, and the impurity concentration of at least one of said first and fifth semiconductor regions is less than the impurity concentration of at least one of said sixth and seventh semiconductor regions.

16. A constant-voltage-diode, comprising:
a first semiconductor region of first conductivity type;
a second semiconductor region of a second conductivity type, said second conductivity type being different from said first conductivity type, said first and second semiconductor regions contacting each other such as to form a first pn junction therebetween;
a third semiconductor region of said second conductivity type contacting said second semiconductor region;
a plurality of fourth semiconductor regions of said first conductivity type contacting and being at least partially surrounded by said second semiconductor region;
a fifth semiconductor region of said second conductivity type contacting said first semiconductor region and being spaced from said second semiconductor region;
a sixth semiconductor region of said second conductivity type contacting said fifth semiconductor region;
a plurality of seventh semiconductor regions of said first conductivity type contacting and being at least partially surrounded by said fifth semiconductor region; and
first and second electrodes in electrical contact with said sixth and third semiconductor regions, respectively;

wherein said third semiconductor region is interposed between said fourth semiconductor regions and said second electrode to embed said fourth semiconductor regions and separate them from the second electrode;

wherein the impurity concentration of at least one of said first and second semiconductor regions is less than the impurity concentration of at least one of said third and said plurality of fourth semiconductor regions, and the impurity concentration of at least one of said first and fifth semiconductor regions is less than the impurity concentration of at least one of said sixth and said plurality of seventh semiconductor regions.

17. A constant-voltage-diode according to claim 16, further comprising a plurality of eighth semiconductor regions of said first conductivity type interconnecting said plurality of fourth semiconductor regions, said plurality of eighth semiconductor regions having a lower impurity concentration than said plurality of fourth semiconductor regions.

18. A constant-voltage-diode according to claim 17, further comprising a plurality of ninth semiconductor regions of said first conductivity type interconnecting said plurality of seventh semiconductor regions, said plurality of ninth semiconductor regions having a lower impurity concentration than said plurality of seventh semiconductor regions.

19. A constant-voltage-diode according to claim 17, wherein said plurality of eighth semiconductor regions contact said third semiconductor region such that said third semiconductor region is interposed between the eighth semiconductor regions and said second electrode to embed the eighth semiconductor regions and separate them from said second electrode.

20. A constant-voltage-diode according to claim 18, wherein said plurality of ninth semiconductor regions contacts said sixth semiconductor region such that said sixth semiconductor region is interposed between the ninth semiconductor regions and said first electrode to embed the ninth semiconductor regions and separate them from said first electrode.

21. A constant-voltage-diode according to claim 18, wherein said plurality of eighth semiconductor regions contact said third semiconductor region such that said third semiconductor region is interposed between the eighth semiconductor regions and said second electrode to embed the eighth semiconductor regions and separate them from said second electrode, and further wherein said plurality of ninth semiconductor regions contacts said sixth semiconductor region such that said sixth semiconductor region is interposed between the ninth semiconductor regions and said first electrode to embed the ninth semiconductor regions and separate them from said first electrode.

22. A constant-voltage-diode, comprising:
a first semiconductor region of a first conductivity type;
a second semiconductor region of a second conductivity type, said second conductivity type being different from said first conductivity type, said first and second semiconductor regions contacting each other such as to form a first pn junction therebetween;
a third semiconductor region of said second conductivity type contacting said second semiconductor region;

a fourth semiconductor region of said first conductivity type contacting and being at least partially surrounded by said second semiconductor region; and
first and second electrodes in electrical contact with said first and third semiconductor regions, respectively;
wherein said third semiconductor region is interposed between said fourth semiconductor region and said second electrode to embed said fourth semiconductor region and separate it from the second electrode; and
wherein said fourth semiconductor region contacts said third semiconductor region such as to form a second pn junction therebetween; and
wherein the first, second, third and fourth semiconductor regions are such that the second pn junction undergoes breakdown when the reverse biasing of the first pn junction exceeds a predetermined amount, said predetermined amount being insufficient to cause breakdown of said first pn junction.

23. A diode according to claim 22, having an additional semiconductor region of said first conductivity type between said first semiconductor region and said first electrode.

24. A constant-voltage-diode, comprising:
a first semiconductor region of a first conductivity type;
a second semiconductor region of a second conductivity type, said second conductivity type being different from said first conductivity type, said first and second semiconductor regions contacting each other such as to form a first pn junction therebetween;
a third semiconductor region of said second conductivity type contacting said second semiconductor region;
a plurality of fourth semiconductor regions of said first conductivity type, each of said plurality of fourth semiconductor regions being at least partially surrounded by said second semiconductor region; and
first and second electrodes in electrical contact with said first and third semiconductor regions, respectively;
wherein said third semiconductor region is interposed between said fourth semiconductor regions and said second electrode to embed said fourth semiconductor regions and separate them from the second electrode; and
wherein said plurality of fourth semiconductor regions contact said third semiconductor region so as to form a plurality of second pn junctions therebetween; and
wherein the first, second, third and plurality of fourth semiconductor regions are such that the plurality of second pn junctions undergo breakdown when the reverse biasing of said first pn junction exceeds a predetermined amount, said predetermined amount being insufficient to cause breakdown of said first pn junction.

25. A bi-directional constant-voltage diode, comprising:
a first semiconductor region of a first conductivity type;
a second semiconductor region of a second conductivity type, said second conductivity type being different from said first conductivity type, said first and second semiconductor regions contacting each other so as to form a first pn junction therebetween;

a third semiconductor region of said second conductivity type contacting said second semiconductor region;

a plurality of fourth semiconductor regions of said first conductivity type contacting and being at least partially surrounded by said second semiconductor regions;

wherein said fourth semiconductor regions contact said third semiconductor region such as to form a second pn junction therebetween;

a fifth semiconductor region of second conductivity type contacting said first semiconductor region and being spaced from said second semiconductor region;

wherein said fifth and first semiconductor regions contact each other such as to form a third pn junction therebetween;

a sixth semiconductor region of said second conductivity type contacting said fifth semiconductor region;

a plurality of seventh semiconductor regions of said first conductivity type contacting and being at least partially surrounded by said fifth semiconductor region;

wherein said seventh semiconductor regions contact said sixth semiconductor region such as to form a fourth pn junction therebetween; and first and second electrodes in electrical contact with said sixth and third semiconductor regions, respectively;

wherein said third semiconductor region is interposed between said fourth semiconductor regions and said second electrode to embed said fourth semiconductor regions and separate them from the second electrode;

wherein the impurity concentration of at least one of said first and second semiconductor regions is less than the impurity concentration of at least one of said third and said plurality of fourth semiconductor regions, and the impurity concentration of at least one of said first and fifth semiconductor regions is less than the impurity concentration of at least one of said sixth and said plurality of seventh semiconductor regions;

wherein the second pn junction undergoes breakdown when the one reverse biasing of the first pn junction exceeds a predetermined amount, said predetermined amount being insufficient to cause breakdown of said first pn junction; and the fourth pn junction undergoes breakdown when the another reverse biasing of the third pn junction exceeds a predetermined amount, said amount being insufficient to cause breakdown of said third pn junction.

* * * * *